United States Patent
Abou Ghaida et al.

(10) Patent No.: US 8,898,606 B1
(45) Date of Patent: Nov. 25, 2014

(54) LAYOUT PATTERN CORRECTION FOR INTEGRATED CIRCUITS

(71) Applicant: GLOBALFOUNDRIES Inc., Grand Cayman (KY)

(72) Inventors: Rani Abou Ghaida, San Jose, CA (US); Ahmed Mohyeldin, San Jose, CA (US); Piyush Pathak, Fremont, CA (US); Swamy Muddu, Milapitas, CA (US); Vito Dai, Santa Clara, CA (US); Luigi Capodieci, Santa Cruz, CA (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 14/080,866

(22) Filed: Nov. 15, 2013

(51) Int. Cl.
*G06F 17/50* (2006.01)

(52) U.S. Cl.
CPC ........ *G06F 17/5081* (2013.01); *G06F 17/5077* (2013.01)
USPC ............ 716/111; 716/126; 716/129; 716/130

(58) Field of Classification Search
CPC ............ G06F 17/5077; G06F 17/5068; G06F 17/5072; G06F 17/5054; G06F 17/5082; G06F 17/5045; G06F 17/509; G06F 2217/62; H05K 3/0005
USPC .................................. 716/111, 126, 129, 130
See application file for complete search history.

(56) References Cited

U.S. PATENT DOCUMENTS

2007/0028205 A1*  2/2007  Nakano et al. .................. 716/19

OTHER PUBLICATIONS

U.S. Appl. No. 13/901,164, filed May 23, 2013.
U.S. Appl. No. 13/755,374, filed Jan. 31, 2013.

* cited by examiner

*Primary Examiner* — Vuthe Siek
(74) *Attorney, Agent, or Firm* — Ditthavong & Steiner, P.C.

(57) ABSTRACT

A process and apparatus are provided for automated pattern-based semiconductor design layout correction. Embodiments include: determining a portion of a layout of an IC design, the portion comprising a first pattern of a plurality of routes connecting a plurality of design connections; determining one or more sets of the plurality of design connections based on the plurality of routes; and determining, by a processor, a second pattern of a plurality of routes connecting the plurality of design connections within the portion based on the one or more sets.

20 Claims, 12 Drawing Sheets

100

LAYOUT PATTERN CORRECTION FOR INTEGRATED CIRCUITS

TECHNICAL FIELD

The present disclosure relates to a manufacture of semiconductor devices, such as integrated circuits (ICs). The present disclosure is particularly applicable to improving a density of features (e.g., cell utilization, reducing a number of routing layers, etc.) in an IC design and/or improving a yield of a resulting device.

BACKGROUND

In a fabrication of semiconductor devices, IC designs are frequently required to meet manufacturing constraints to achieve an acceptable manufacturing yield. Accordingly, when such constraints are not met, traditional methods initiate a manual modification, which is an expensive and time consuming task, or utilize an automated engineering change order (ECO). However, automated ECO methods frequently rip-up a net and re-route, which in many cases, results even more violations of manufacturing constraints. Additionally, automated ECO may modify or displace standard-cells, thereby causing violations of manufacturing constraints. Further, such automated methods may never converge to a feasible solution and may have a large effect on timing and signal integrity, thereby resulting in even further violations of manufacturing constraints.

A need therefore exists for methodologies and apparatus for automated pattern-based semiconductor design layout correction.

SUMMARY

An aspect of the present disclosure is a method of determining a second pattern of an IC design by, inter alia, determining one or more sets of a plurality of design connections based on a plurality of routes of an IC design.

Another aspect of the present disclosure is an apparatus capable of determining a second pattern of an IC design by, inter alia, determining one or more sets of a plurality of design connections based on a plurality of routes of an IC design.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining a portion of a layout of an IC design, the portion including a first pattern of a plurality of routes connecting a plurality of design connections; determining one or more sets of the plurality of design connections based on the plurality of routes; and determining, by a processor, a second pattern of a plurality of routes connecting the plurality of design connections within the portion based on the one or more sets.

Aspects include a method including determining a connection type for a route of the first pattern, the route connecting design connections of a set of the one or more sets; and selecting a pre-determined route for connecting design connections of the set from a plurality of pre-determined routes for the connection type, the determining of the second pattern being further based on the pre-determined route. Further aspects include determining a connection type for a second route of the first pattern, the second route connecting design connections of a second set of the one or more sets; and selecting a pre-determined route for connecting design connections of the second set from a plurality of pre-determined routes for the connection type of the second route, the determining of the second pattern being further based on the pre-determined route for the second set. Some aspects include: selecting a second pre-determined route for connecting design connections of the first set from the plurality of pre-determined routes for the connection type of the first route; determining a third pattern based on the second pre-determined route; and modifying the IC design to include a route of the second or third pattern. Additional aspects include routing, by the processor, a route connecting design connections of a set of the one or more sets, the determining of the second pattern being further based on the routing. Further aspects include routing, by the processor, a route connecting design connections of a second set of the one or more sets based on the routing of the route connecting design connections of the first set, the determining of the second pattern being further based on the routing of the route connecting design connections of the second set. Some aspects include: determining a third pattern that includes a plurality of routes connecting design connections of the first and second sets by: routing, by the processor, a route of the third pattern connecting design connections of the second set; and routing, by the processor, a route of the third pattern connecting design connections of the first set based on the routing of the route of the third pattern connecting design connections of the second set; and modifying the IC design to include a route of the second or third pattern. Additional aspects include: overlaying the second pattern on the first pattern; determining one or more alignment constraints between a route of the first pattern and a route of the second pattern; and initiating layout compaction of the IC design based on the overlaying and the one or more alignment constraints.

Another aspect of the present disclosure is an apparatus including: a processor; and memory including computer program code for a program, the memory and the computer program code configured to, with the processor, cause the apparatus to perform at least the following, determine a portion of a layout of an IC design, the portion including a first pattern of a plurality of routes connecting a plurality of design connections; determine one or more sets of the plurality of design connections based on the plurality of routes; and determine a second pattern of a plurality of routes connecting the plurality of design connections within the portion based on the one or more sets.

Some aspects include an apparatus further caused to: determine a connection type for a route of the first pattern, the route connecting design connections of a set of the one or more sets; and select a pre-determined route for connecting design connections of the set from a plurality of pre-determined routes for the connection type, the determining of the second pattern being further based on the pre-determined route. Additional aspects include an apparatus further caused to: determine a connection type for a second route of the first pattern, the second route connecting design connections of a second set of the one or more sets; and select a pre-determined route for connecting design connections of the second set from a plurality of pre-determined routes for the connection type of the second route, the determining of the second pattern being further based on the pre-determined route for the second set. Some aspects include an apparatus further caused to: select a second pre-determined route for connecting design connections of the first set from the plurality of pre-determined routes for the connection type of the first route; determine a third pattern based on the second pre-determined route; and modify the IC design to include a route of the second or third pattern. Additional aspects include an apparatus further caused to route a route connecting design connections of a set of the one or more sets, the determining of the second pattern being further based on the routing. Some aspects include an apparatus further caused to route a route connecting design connections of a second set of the one or more sets based on the routing of the route connecting design connections of the first set, the determining of the second pattern being further based on the routing of the route connecting design connections of the second set. Further aspects include an apparatus further caused to: determine a third pattern that includes a plurality of routes connecting design connections of the first and second sets by: routing a route of the third pattern connecting design connections of the second set; and routing a route of the third pattern connecting design connections of the first set based on the routing of the route of the third pattern connecting design connections of the second set; and modify the IC design to include a route of the second or third pattern. Some aspects include an apparatus further caused to: overlay the second pattern on the first pattern; determine one or more alignment constraints between a route of the first pattern and a route of the second pattern; and initiate layout compaction of the IC design based on the overlay and the one or more alignment constraints.

Another aspect of the present disclosure is a method including: determining a portion of a layout of an IC design, the portion including a first pattern including a first route connecting a first set of design connections and a second route connecting a second set of design connections; associating the first and second sets of design connections with the first and second routes, respectively; and determining, by a processor, a second pattern for the portion based on the associating, the second pattern including a route connecting design connections of the first set.

Some aspects include: determining a connection type for the first route of the first pattern; selecting the route of the second pattern from a plurality of pre-determined routes for the connection type of the first route of the first pattern; determining a connection type for the second route of the first pattern; selecting a second route of the second pattern from a plurality of pre-determined routes for the connection type of the second route of the first pattern, the second route of the second pattern connecting design connections of the second set; determining a third pattern including a route connecting design connections of the first set by selecting the route of the third pattern from the plurality of pre-determined routes for the connection type of the first route of the first pattern; and modifying the IC design to include the second or third pattern in the portion. Further aspects include: determining the second pattern by: removing the first pattern from the portion; routing, by the processor, the route of the second pattern; and routing, by the processor, a second route of the second pattern based on the routing of the route of the second pattern, the second route of the second pattern connecting design connections of the second set; determining a third pattern including a first route connecting design connections of the first set and a second route connecting design connections of the second set by: removing the first pattern from the portion; routing, by the processor, the second route of the third pattern; and routing, by the processor, the first route of the third pattern based on the routing of the second route of the third pattern; and modifying the IC design to include the second or third pattern in the portion. Additional aspects include: initiating layout compaction of the IC design using the second pattern as a guiding pattern; and modifying the IC design by replacing the first pattern with the second pattern of the IC design and initiating layout compaction of the modified IC design.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of error generation attendant upon manual correction of difficult-to-manufacture semiconductor layout patterns and difficult coding attendant upon automated rule-based correction of such layout patterns. The problems are solved, for instance, by determining one or more sets of a plurality of design connections based on a plurality of routes of an IC design.

Methodology in accordance with embodiments of the present disclosure includes: determining a portion of a layout of an IC design, the portion including a first pattern of a plurality of routes connecting a plurality of design connections; determining one or more sets of the plurality of design connections based on the plurality of routes; and determining, by a processor, a second pattern of a plurality of routes connecting the plurality of design connections within the portion based on the one or more sets.

Figure 1:
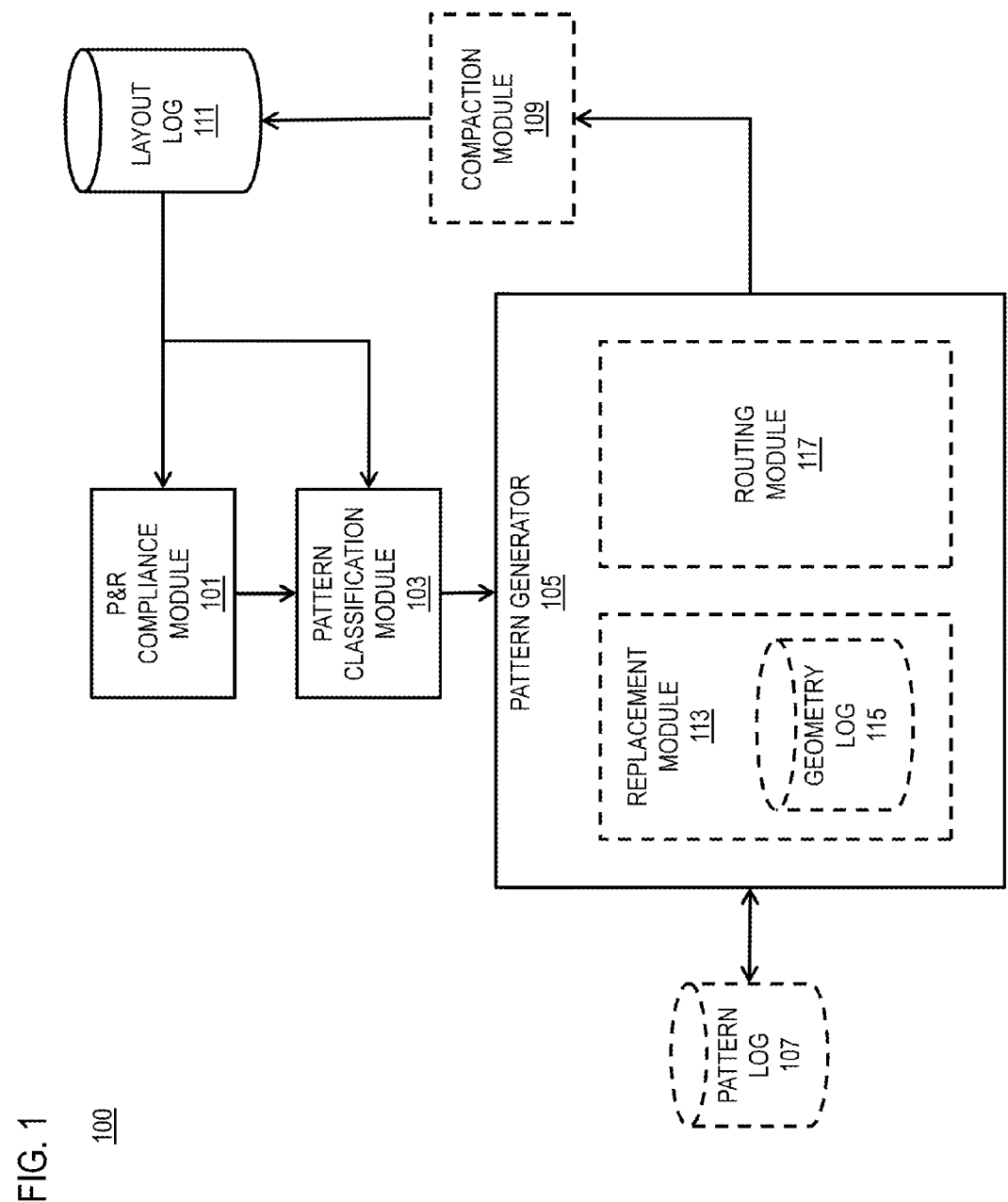
FIG. 1 illustrates a pattern correction platform that performs automated replacement and/or routing, in accordance with an exemplary embodiment.

FIG. 1 is a diagram of the components of a layout correction platform 100, according to an exemplary embodiment. The platform 100 includes computing hardware (such as described with respect to FIG. 14), as well as one or more components configured to execute the processes described herein. It is contemplated that the functions of these components may be combined in one or more components or performed by other components of equivalent functionality. As shown, the layout correction platform 100 includes a place and route (P&R) compliance module 101, a pattern classification module 103, a pattern generator 105 having access to a pattern log 107, a compaction module 109, and a layout log 111. Additionally, the pattern generator 105 may optionally include a replacement module 113 having access to a geometry log 115 and/or a routing module 117. For instance, platform 100 may include log 107 and exclude log 115 and modules 109, 113, and 117, may include log 107 and 115 and module 113 and exclude modules 109 and 117, may include log 107 and routing module 117 and exclude modules 109 and 113 and log 115, and the like.

P&R compliance module 101 is configured to determine compliance of an IC design layout retrieved from layout log 111. Compliance module 101 may be configured to perform the following: a design rule check of the IC design; an optical rule check of a resulting IC of the IC design; a physical verification of the resulting design; a lithography and/or printability simulation of the IC design; an inspection on a wafer including the resulting IC; and a comparison of the IC design with one or more forbidden patterns and/or layout configurations. Such compliance checks may be performed using traditional methods, for instance, a PROLITH tool. Compliance module 101 may be configured to determine a portion (or first pattern) of a layout that is non-compliant and to subsequently verify that a modified portion (e.g., a second pattern) is compliant.

Pattern classification module 103 is configured to determine a function of a portion or pattern of a layout of layout log 111. For instance, classification module 103 receives an indication of a portion of the IC design from the P&R compliance module 101, retrieves the portion from the layout log 111, and transmits a function of the portion to the pattern generator 105. In one example, patterns having identical functions may replace one another without affecting design connectivity of the IC design. Furthermore, classification module 103 may be configured to map one or more design connections to a coordinate system. For instance, the classification module 103 generates a numerical representation of a pattern function within the portion of the IC design. Additionally, the classification module 103 may be configured to determine a portion of the IC design to be separate from routes or nets of a pattern of the IC design. For instance, the classification module 103 retrieves a polygon indicating a region of the IC design from the compliance module 101 and includes the polygon in the (mapped) function transmitted to the pattern generator 105.

The pattern generator 105 is configured to select and/or generate a pattern based on a function. For instance, pattern generator 105 receives a function from classification module 103 and selects a pattern from pattern log 107. Additionally, or alternatively, the pattern generator 105 generates a pattern that complies with the function and modifies a layout in layout log 111. Additionally, pattern generator 105 may be configured to generate and store patterns into log 107.

The pattern generator 105 may optionally include a replacement module 113. The replacement module 113 is configured to generate a pattern based on design connections, for instance, from the pattern classification module 103, using geometries stored in geometry log 115. Additionally, the replacement module 113 may associate each possible geometry of log 115 with one or more pre-specified connection types. By way of example, a particular geometry may be associated with a straight-line connection, one-track-off connection, and the like. The replacement module 113 may also prune out layout variants that violate manufacturing and/or electrical constraints. For instance, the compliance module 101 may determine a particular geometry and/or combination of geometries (e.g., pattern) are in violation of a manufacturing constraint, and the replacement module 113 prunes (e.g., indicates as unusable, removes from log 115, etc.) the geometry and/or combination. As such, the replacement module 113 may enable a generation of new patterns that are compliant with manufacturing constraints and may be stored in log 107 for further use.

Additionally, the replacement module 113 may identify multi-layer patterns. By way of example, a particular replacement pattern includes anchor layers having a geometry that is included in a bad pattern (e.g., the pattern being replaced) and/or varying layers with different geometries than the bad pattern. Furthermore, the replacement module 113 may determine whether a layer above and below are anchor layers. For instance, the replacement module 113 determines whether a M3 layer is a varying layer and whether V2 and V3 layers are anchored. Additionally, the replacement module 113 may anchor at a layer above-all and below-all. For instance, the replacement module 113 anchors V1 and V3 layers when M2, V2, and M3 layers are varying layers.

The pattern generator 105 may optionally include a routing module 117. The routing module 117 is configured to generate a pattern based on design connections, for instance, from the pattern classification module 103, using a routing engine. Additionally, the routing module 117 may generate multiple patterns by altering an order of routing of a plurality of sets of design connections.

The compaction module 109 uses one or more computational algorithms to minimize (e.g., compaction) a layout footprint while maintaining various constraints. A two-dimensional compaction of a layout may be performed using a one dimensional compaction in one direction and a one dimensional compaction in the other direction.

Figure 2:
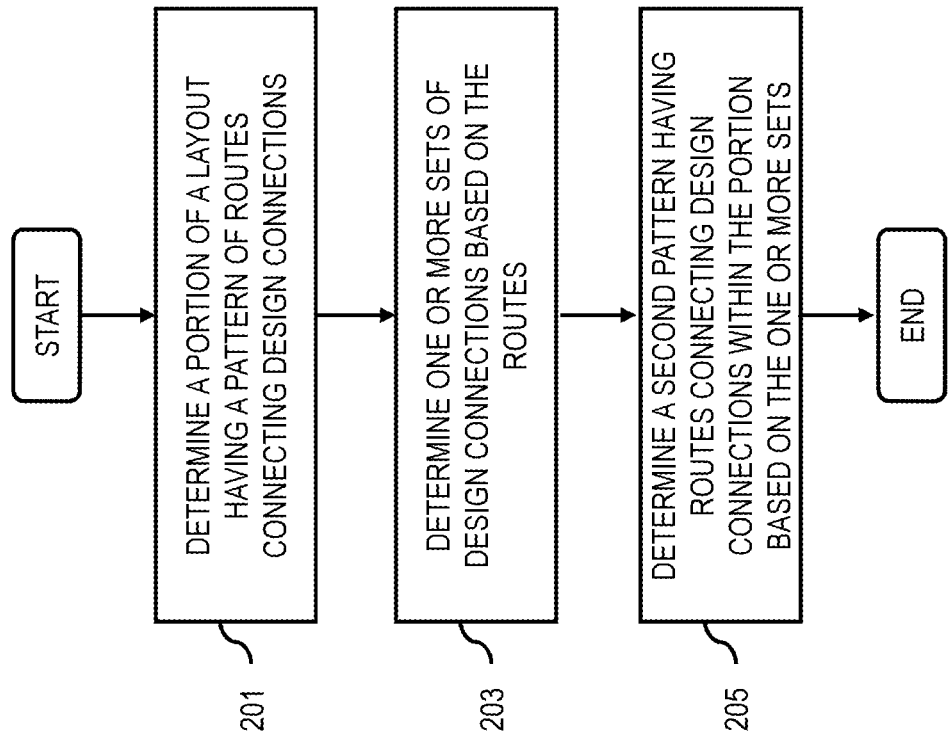
FIG. 2 is a flowchart of a process for automated pattern-based semiconductor design layout correction, in accordance with an exemplary embodiment.
Figure 14:
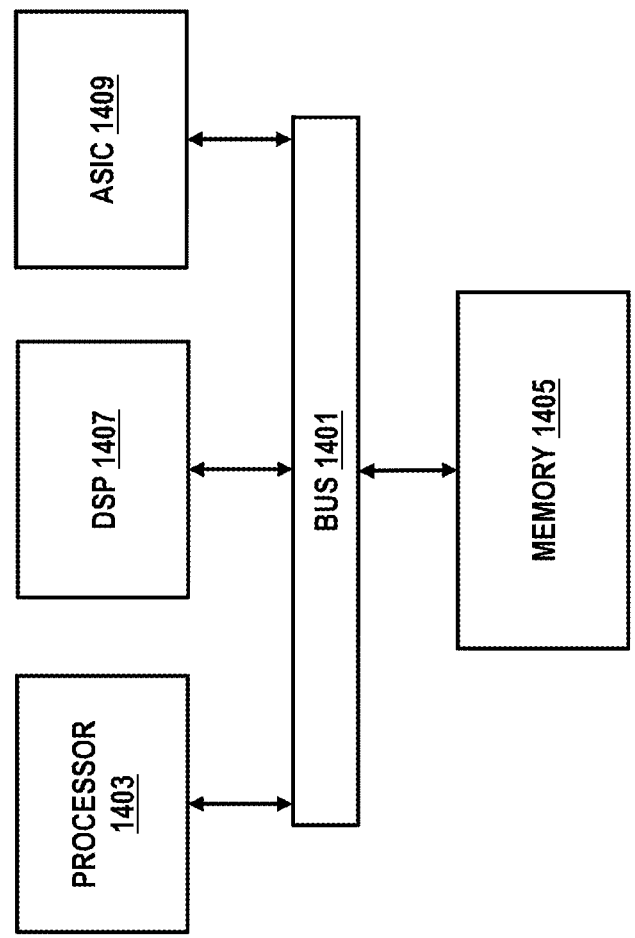
FIG. 14 schematically illustrates a computer system for implementing various processes, according to an exemplary embodiment.

FIG. 2 is a flowchart of a process for automated pattern-based design layout correction, according to an exemplary embodiment. For the process of FIG. 2, the layout correction platform 100 performs the process and is implemented in, for instance, a chip set including a processor and a memory as shown in FIG. 14.

Figure 3:
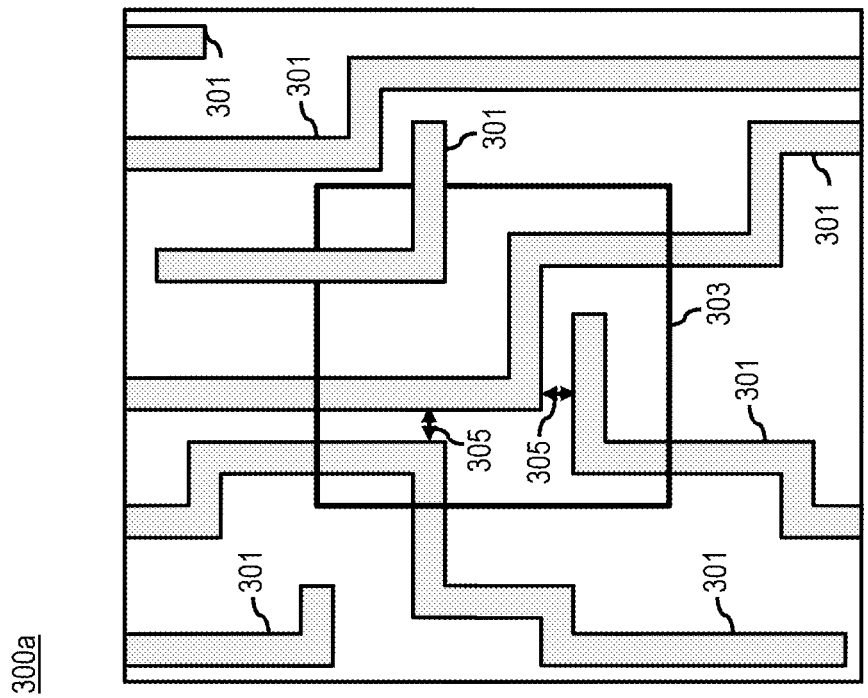
FIGS. 3 through 6 illustrate a process for automated pattern-based semiconductor design layout correction, in accordance with various exemplary embodiments.

In step 201, the compliance module 101 determines a portion of a layout of an IC design having a pattern of routes connecting design connections. Adverting to FIG. 3, the compliance module 101 determines routes 301 within portion 303 of IC design 300a to be difficult to manufacture due to a tight separation distance 305 between the routes 301 within portion 303. The compliance module 101 may determine the portion 303 by various other criteria, for instance, a violation of manufacturing and/or electrical constraints.

Figure 4:
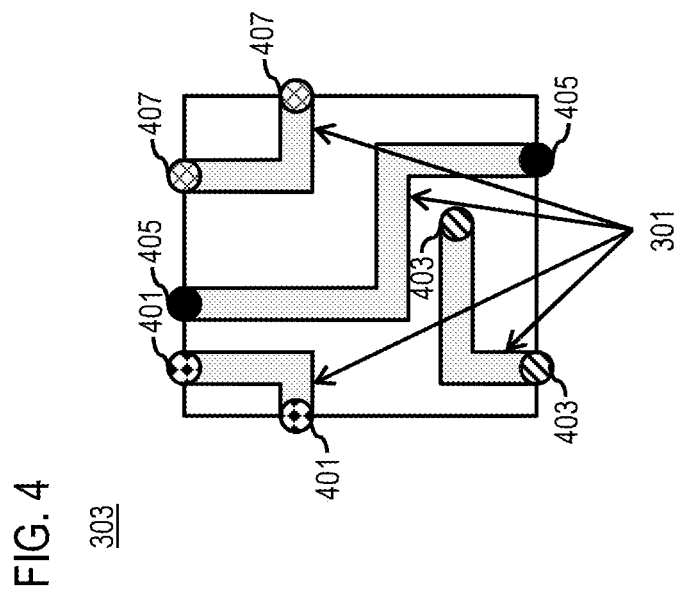

Next, in step 203, the classification module 103 determines one or more sets of design connections based on the routes. Adverting to FIG. 4, the classification module 103 determines sets of design connections 401, 403, 405, and 407 of portion 303 by, for example, determining a set of start and end points for each route within the portion 303. The classification module 103 may then discard routes 301 within the portion 303 and map the design connections 401 through 407, for instance, using the lower left corner of portion 303 as an origin.

Figure 5:
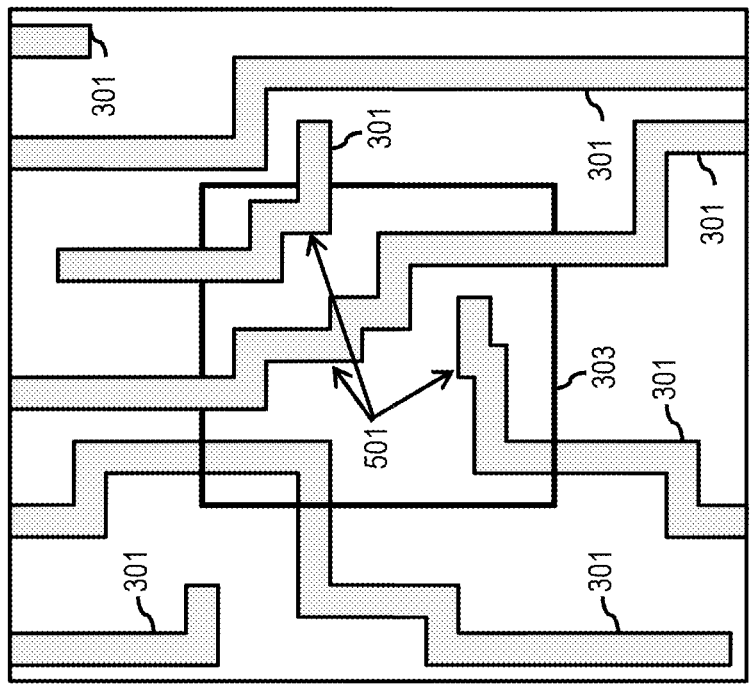

The pattern generator 105 then determines, as in step 205, a second pattern having routes connecting the design connections within the portion based on the one or more sets. Adverting to FIG. 5, the portion 303 includes routes 501 connecting the sets of design connections 401, 403, 405, and 407 of a modified IC design 300b. The pattern generator 105 may select the routes 501 from a log (e.g., 107), generate the routes 501 (e.g., using various steps illustrated in FIGS. 7 through 13), and the like.

Figure 6:
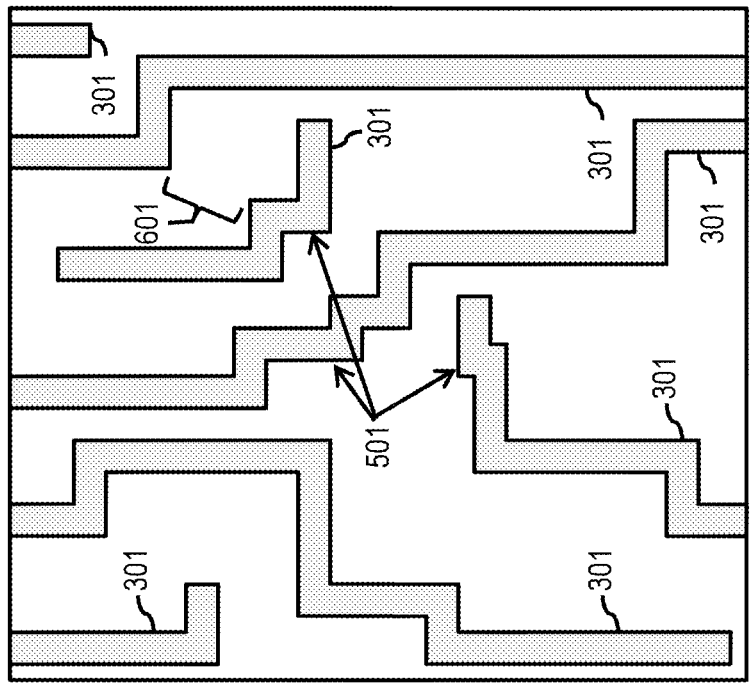

The compaction module 109 may optionally compact the modified IC design 300b. As illustrated in FIG. 6, the compaction module 109 modifies a route 301 to increase a separation distance 601, thereby improving a manufacturability of a resulting IC device. It is noted that the compaction module 109 may also move routes 301 closer together, for instance, to enable a higher density of features (e.g., routes).

Figure 7:
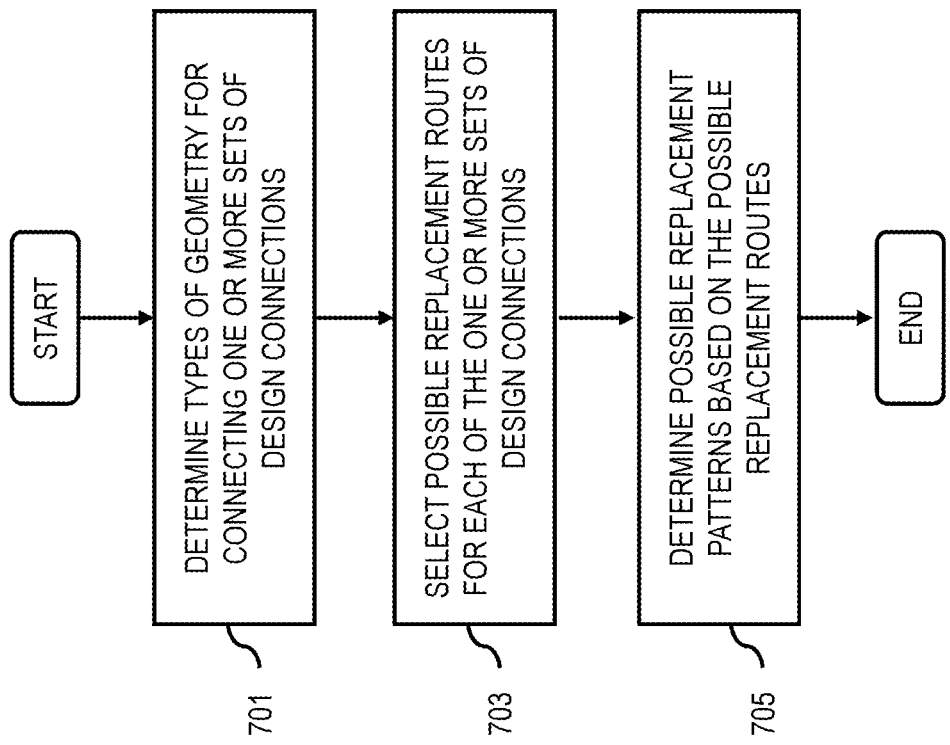
FIG. 7 is a flowchart of a process for automated pattern-based semiconductor design layout correction using replacement routes, in accordance with an exemplary embodiment.

FIG. 7 is a flowchart of a process for context-aware automated pattern-based semiconductor design layout correction using replacement routes, according to an exemplary embodiment. For the process of FIG. 7, the layout correction platform 100 performs the process and is implemented in, for instance, a chip set including a processor and a memory as shown in FIG. 14.

Figure 8A:
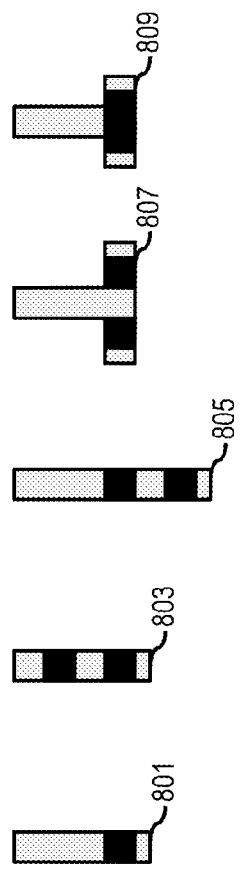
FIGS. 8A, 8B, and 8C illustrate various replacement routes, in accordance with various exemplary embodiments.
Figure 8B:
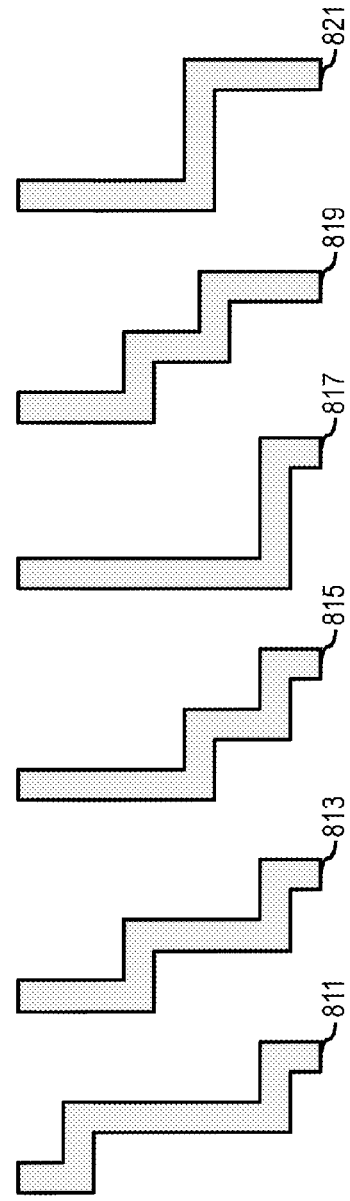
Figure 8C:
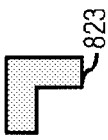

At step 701, the replacement module 113 determines types of geometries for a route. By way of example, the replacement module 113 identifies a first set of design connections as a straight-line connection to vertical integration access (VIA), a second set of design connections as a two-track-off connections, and a third set of design connections as a one-track orthogonal connection. Next, the replacement module 113 selects, as in step 703, possible replacement routes for each type. For example, the replacement module 113 accesses a log 115 containing various geometries shown in FIGS. 8A, 8B, and 8C. FIG. 8A illustrates straight-line connection to VIA geometries 801 through 809. Additionally, FIG. 8B illustrates two-track-off connections 811 through 821, and FIG. 8C illustrates a one-track orthogonal connection 823.

Figure 9B:
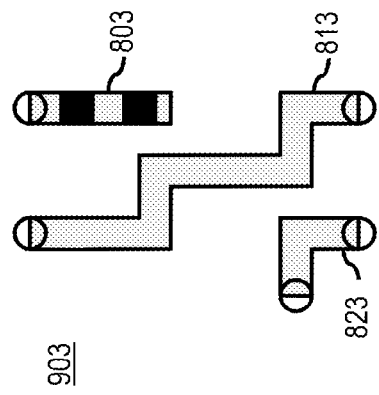
FIGS. 9A, 9B, 9C, and 9D illustrate various replacement patterns, in accordance with various exemplary embodiments.
Figure 9D:
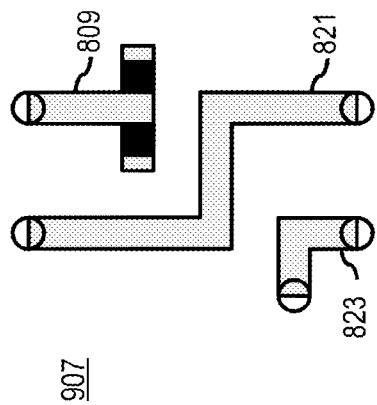
Figure 9A:
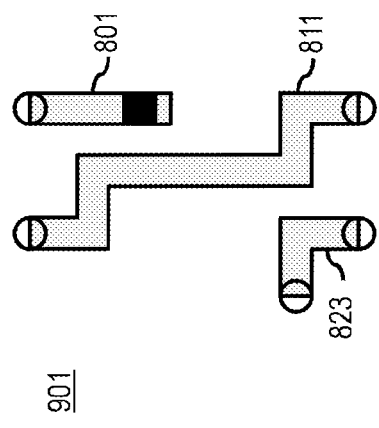
Figure 9C:
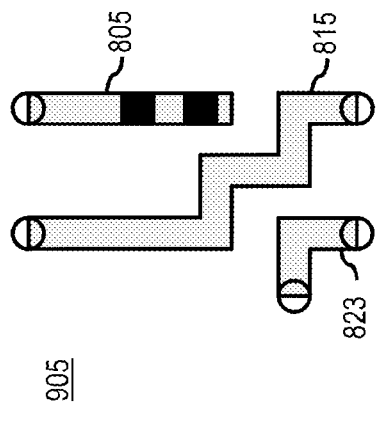

Next, the replacement module 113 determines, as in step 705, possible replacement patterns based on the possible replacement routes. For example, the replacement module 113 omits a combination of geometries 807, 813, and 823 due to an overlap when selected to connect three sets of particular design connections of FIGS. 9A, 9B, 9C, and 9D. As illustrated in FIG. 9A, pattern 901 includes geometries 801, 811, and 823. Additionally, patterns 903, 905, and 907 of FIGS. 9B, 9C, and 9D, respectively, include geometries 803, 813, and 823, geometries 805, 815, and 823, and geometries 809,
821, and 823, respectively. It is noted that the patterns 901 through 907 may be added to the pattern log 107 and thus may be re-used.

Figure 10:
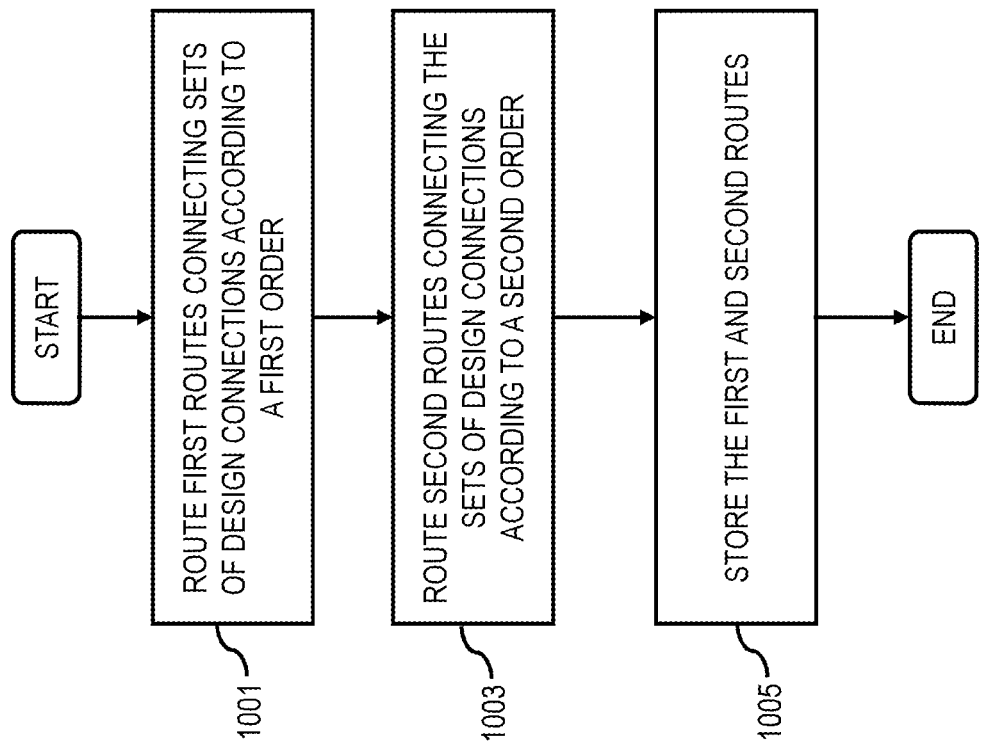
FIG. 10 is a flowchart of a process for automated pattern-based semiconductor design layout correction using a routing engine, in accordance with an exemplary embodiment.

FIG. 10 is a flowchart of a process for automated pattern-based semiconductor design layout correction using a routing engine. For the process of FIG. 10, the layout correction platform 100 performs the process and is implemented in, for instance, a chip set including a processor and a memory as shown in FIG. 14.

Figure 11A:
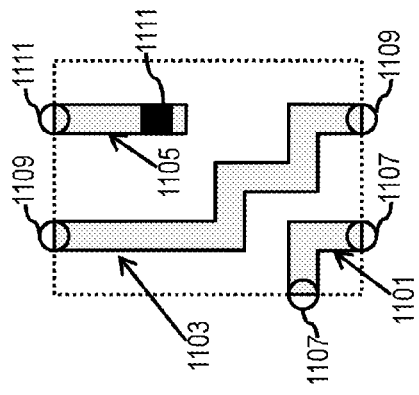
FIGS. 11A, 11B, and 11C illustrate a process for automated pattern-based semiconductor design layout correction using a routing engine, in accordance with various exemplary embodiments.
Figure 11B:
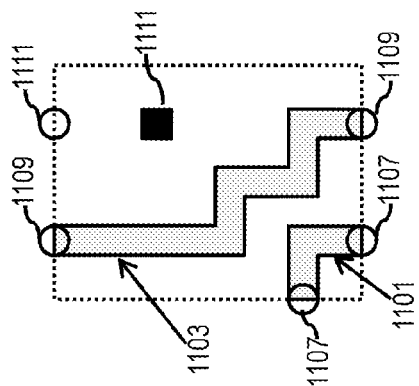
Figure 11C:
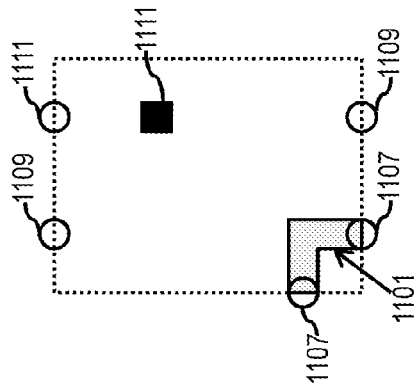
Figure 12A:
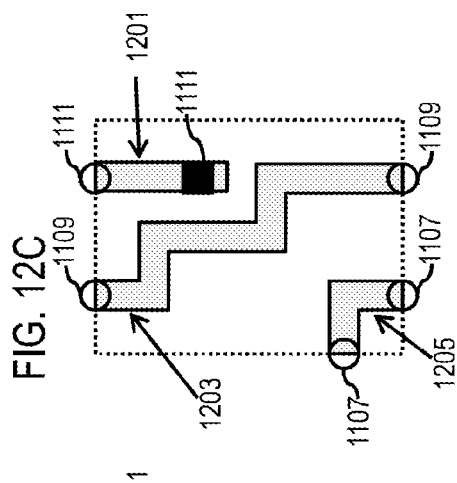
FIGS. 12A, 12B, and 12C illustrate another process for automated pattern-based semiconductor design layout correction using a routing engine, in accordance with various exemplary embodiments.
Figure 12B:
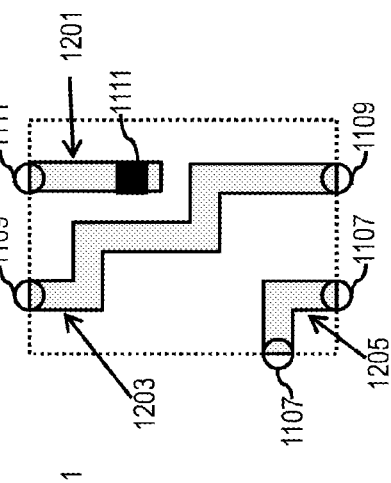
Figure 12C:
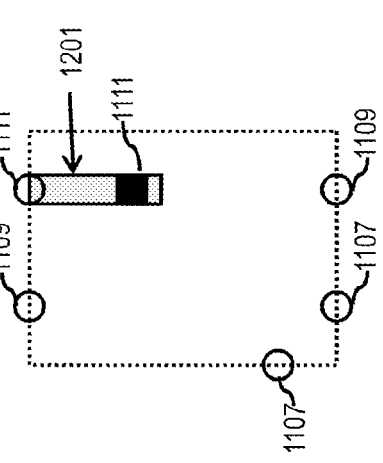

At step 1001, the routing module 117 routes first routes connecting sets of design connections according to a first order. FIGS. 11A, 11B, and 11C illustrate the routing module 117 routing routes 1101, 1103, and 1105 to connect design connections 1107, 1109, and 1111, respectively. The routing module 117 then routes, as in step 1003, second routes connecting the sets of design connections according to a second order. FIGS. 12A, 12B, and 12C illustrate the routing module 117 routing routes 1201, 1203, and 1205 to connect design connections 1111, 1109, and 1107, respectively. In step 1005, the routing module 117 stores the first and second routes in the pattern log 107. It is contemplated that the routing module 117 may prune and/or trim patterns and/or selectively store patterns (e.g., first and second routes) based on a manufacturability of a respective pattern.

Figure 13:
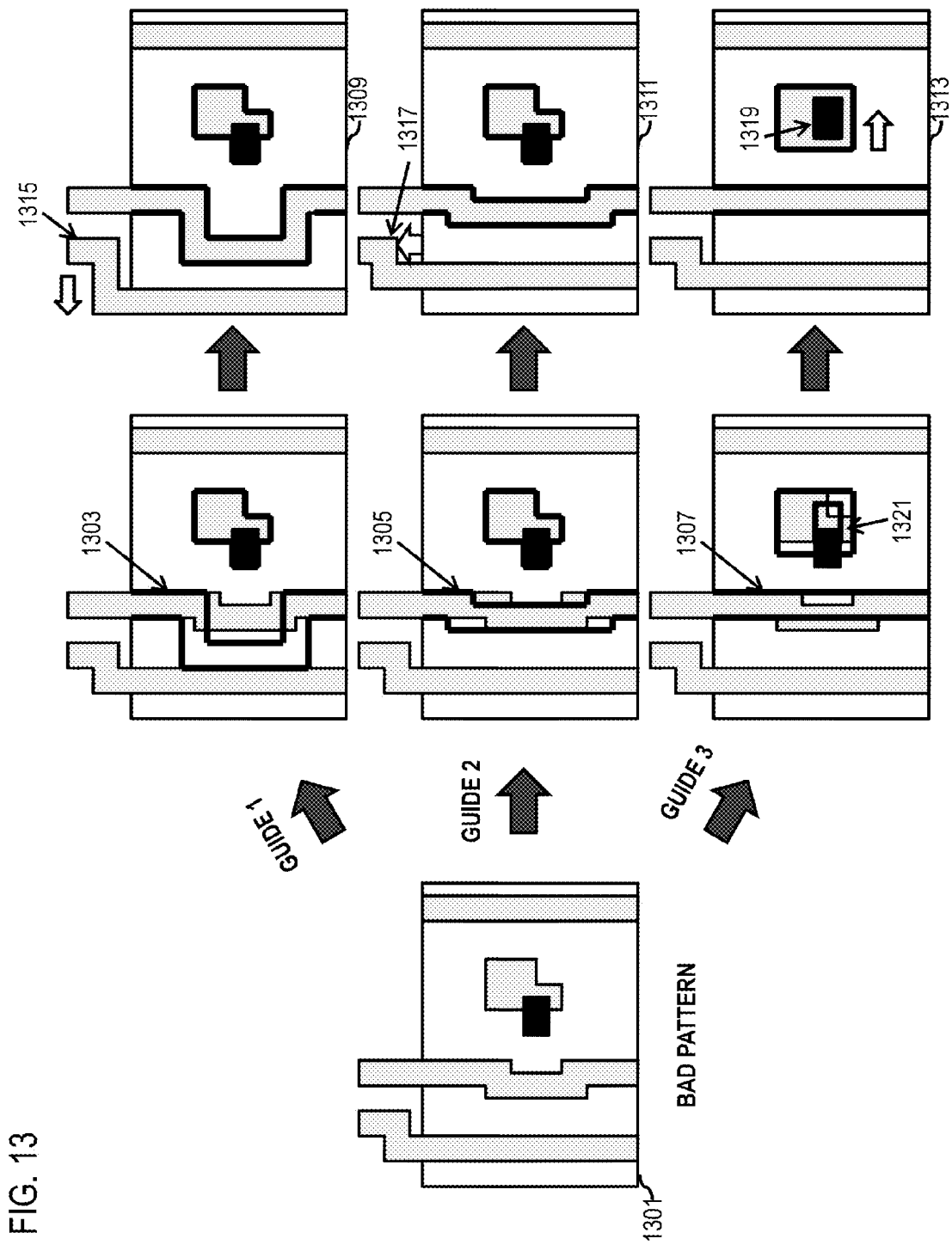
FIG. 13 illustrates a process for automated pattern-based semiconductor design layout correction using compaction, in accordance with an exemplary embodiment.

FIG. 13 illustrates the compaction module 109 using a pattern, for instance, of log 107, generated by replacement module 113, generated by routing module 117, and the like as a guide pattern. As shown, the compaction module 109 modifies a bad pattern 1301 using guide patterns 1303, 1305, and 1307 to determine good patterns 1309, 1311, and 1313, respectively. By way of example, guide patterns 1303-1307 are generated by pattern generator 105 and overlaid on bad pattern 1301 while ensuring common parts are perfectly aligned. That is, portions of the guiding patterns 1303-1307 are aligned with the bad pattern 1301 as shown in FIG. 13. Next, alignment constraints between edges of the bad pattern 1301 and edges of each of the guide patterns 1303-1307 (e.g., bad) are provided to compaction module 109 for compaction. For instance, as shown, the compaction module 109 moves the left route 1315 left in good pattern 1309, moves the external jog 1317 up in good pattern 1311, and moves the via 1319 right and removes jogs 1321 in the good pattern 1313.

FIG. 14 is a diagram of a chip set that can be used to implement various exemplary embodiments. Chip set 1400 is programmed to perform an automated pattern-based semiconductor design layout correct as described herein and includes, for instance, processor and memory components incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in exemplary embodiments the chip set can be implemented in a single chip. Chip set 1400, or a portion thereof, constitutes a means for performing one or more steps of FIGS. 1 through 13.

The chip set 1400 may include a communication mechanism such as a bus 1401 for passing information among the components of the chip set 1400. A processor 1403 has connectivity to the bus 1401 to execute instructions and process information stored in, for example, a memory 1405. The processor 1403 may include one or more processing cores with each core configured to perform independently. A multi-core processor enables multiprocessing within a single physical package. Examples of a multi-core processor include two, four, eight, or greater numbers of processing cores. Alternatively or in addition, the processor 1403 may include one or more microprocessors configured in tandem via the bus 1401 to enable independent execution of instructions, pipelining, and multithreading. The processor 1403 may also be accompanied by one or more specialized components to perform certain processing functions and tasks such as one or more digital signal processors (DSP) 1407, or one or more application-specific integrated circuits (ASIC) 1409. A DSP 1407 typically is configured to process real-world signals (e.g., sound) in real time independently of the processor 1403. Similarly, an ASIC 1409 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 1403 and accompanying components have connectivity to the memory 1405 via the bus 1401. The memory 1405 includes both dynamic memory (e.g., RAM, magnetic disk, writable optical disk, etc.) and static memory (e.g., ROM, CD-ROM, etc.) for storing executable instructions that when executed perform the inventive steps described herein. The memory 1405 also stores the data associated with or generated by the execution of the inventive steps.

The embodiments of the present disclosure achieve several technical effects, including an automated pattern-based layout-correcting methodology that identifies difficult-to-manufacture patterns, generates patterns, and replaces them with corrected patterns. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
  determining a portion of a layout of an integrated circuit (IC) design, the portion comprising a first pattern of a plurality of routes connecting a plurality of design connections;
  determining a plurality of sets of the plurality of design connections based on the plurality of routes; and
  determining, by a processor, a second pattern of a plurality of routes connecting the plurality of design connections within the portion based on the plurality of sets.

2. The method according to claim 1, comprising:
  determining a connection type for a route of the first pattern, the route connecting design connections of a first set of the plurality of sets; and
  selecting a pre-determined route for connecting design connections of the first set from a plurality of pre-determined routes for the connection type, the determining of the second pattern being further based on the pre-determined route.

3. The method according to claim 2, comprising:
  determining a connection type for a second route of the first pattern, the second route connecting design connections of a second set of the plurality of sets; and
  selecting a pre-determined route for connecting design connections of the second set from a plurality of pre-determined routes for the connection type of the second route, the determining of the second pattern being further based on the pre-determined route for the second set.

4. The method according to claim 3, comprising:
  selecting a second pre-determined route for connecting design connections of the first set from the plurality of pre-determined routes for the connection type of the first route;
  determining a third pattern based on the second pre-determined route; and
  modifying the IC design to comprise a route of the second or third pattern.

5. The method according to claim 1, comprising:
  routing, by the processor, a route connecting design connections of a first set of the plurality of sets, the determining of the second pattern being further based on the routing.

6. The method according to claim 5, comprising:
  routing, by the processor, a route connecting design connections of a second set of the plurality of sets based on the routing of the route connecting design connections of the first set, the determining of the second pattern being further based on the routing of the route connecting design connections of the second set.

7. The method according to claim 6, comprising:
  determining a third pattern that includes a plurality of routes connecting design connections of the first and second sets by:
    routing, by the processor, a route of the third pattern connecting design connections of the second set; and
    routing, by the processor, a route of the third pattern connecting design connections of the first set based on the routing of the route of the third pattern connecting design connections of the second set; and
  modifying the IC design to comprise a route of the second or third pattern.

8. The method according to claim 1, comprising:
  overlaying the second pattern on the first pattern;
  determining one or more alignment constraints between a route of the first pattern and a route of the second pattern; and
  initiating layout compaction of the IC design based on the overlaying and the one or more alignment constraints.

9. An apparatus comprising:
  a processor; and
  memory including computer program code for a program,
  the memory and the computer program code configured to, with the processor, cause the apparatus to perform at least the following,
    determine a portion of a layout of an integrated circuit (IC) design, the portion comprising a first pattern of a plurality of routes connecting a plurality of design connections;
    determine a plurality of sets of the plurality of design connections based on the plurality of routes; and determine a second pattern of a plurality of routes connecting the plurality of design connections within the portion based on the plurality of sets.

10. The apparatus according to claim 9, wherein the apparatus is further caused to:
determine a connection type for a first route of the first pattern, the first route connecting design connections of a first set of the plurality of sets; and
select a pre-determined route for connecting design connections of the first set from a plurality of pre-determined routes for the connection type, the determining of the second pattern being further based on the pre-determined route.

11. The apparatus according to claim 10, wherein the apparatus is further caused to:
determine a connection type for a second route of the first pattern, the second route connecting design connections of a second set of the plurality of sets; and
select a first pre-determined route for connecting design connections of the second set from a plurality of pre-determined routes for the connection type of the second route, the determining of the second pattern being further based on the pre-determined route for the second set.

12. The apparatus according to claim 11, wherein the apparatus is further caused to:
select a second pre-determined route for connecting design connections of the first set from the plurality of pre-determined routes for the connection type of the first route;
determine a third pattern based on the second pre-determined route; and
modify the IC design to comprise a route of the second or third pattern.

13. The apparatus according to claim 9, wherein the apparatus is further caused to:
route a route connecting design connections of a first set of the plurality of sets, the determining of the second pattern being further based on the routing.

14. The apparatus according to claim 13, wherein the apparatus is further caused to:
route a route connecting design connections of a second set of the plurality of sets based on the routing of the route connecting design connections of the first set, the determining of the second pattern being further based on the routing of the route connecting design connections of the second set.

15. The apparatus according to claim 14, wherein the apparatus is further caused to:
determine a third pattern that includes a plurality of routes connecting design connections of the first and second sets by:
routing a route of the third pattern connecting design connections of the second set; and
routing a route of the third pattern connecting design connections of the first set based on the routing of the route of the third pattern connecting design connections of the second set; and
modify the IC design to comprise a route of the second or third pattern.

16. The apparatus according to claim 9, wherein the apparatus is further caused to:
overlay the second pattern on the first pattern;
determine one or more alignment constraints between a route of the first pattern and a route of the second pattern; and
initiate layout compaction of the IC design based on the overlay and the one or more alignment constraints.

17. A method comprising:
determining a portion of a layout of an integrated circuit (IC) design, the portion comprising a first pattern including a first route connecting a first set of design connections and a second route connecting a second set of design connections;
associating the first and second sets of design connections with the first and second routes, respectively; and
determining, by a processor, a second pattern for the portion based on the associating, the second pattern including a route connecting design connections of the first set.

18. The method according to claim 17, further comprising:
determining a connection type for the first route of the first pattern;
selecting the route of the second pattern from a plurality of pre-determined routes for the connection type of the first route of the first pattern;
determining a connection type for the second route of the first pattern;
selecting a second route of the second pattern from a plurality of pre-determined routes for the connection type of the second route of the first pattern, the second route of the second pattern connecting design connections of the second set;
determining a third pattern including a route connecting design connections of the first set by selecting the route of the third pattern from the plurality of pre-determined routes for the connection type of the first route of the first pattern; and
modifying the IC design to comprise the second or third pattern in the portion.

19. The method according to claim 17, further comprising:
determining the second pattern by:
removing the first pattern from the portion;
routing, by the processor, the route of the second pattern; and
routing, by the processor, a second route of the second pattern based on the routing of the route of the second pattern, the second route of the second pattern connecting design connections of the second set;
determining a third pattern including a first route connecting design connections of the first set and a second route connecting design connections of the second set by:
removing the first pattern from the portion;
routing, by the processor, the second route of the third pattern; and
routing, by the processor, the first route of the third pattern based on the routing of the second route of the third pattern; and
modifying the IC design to comprise the second or third pattern in the portion.

20. The method according to claim 17, comprising at least one of the following:
initiating layout compaction of the IC design using the second pattern as a guiding pattern; and
modifying the IC design by replacing the first pattern with the second pattern of the IC design and initiating layout compaction of the modified IC design.

* * * * *